United States Patent
Stainer et al.

(10) Patent No.: US 8,675,252 B2
(45) Date of Patent: Mar. 18, 2014

(54) MULTICOLOR ELECTRONIC DEVICES AND PROCESSES OF FORMING THE SAME BY PRINTING

(75) Inventors: Matthew Stainer, Goleta, CA (US); Nugent Truong, Ventura, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 293 days.

(21) Appl. No.: 13/122,215

(22) PCT Filed: Oct. 21, 2009

(86) PCT No.: PCT/US2009/061460
§ 371 (c)(1),
(2), (4) Date: Apr. 1, 2011

(87) PCT Pub. No.: WO2010/048269
PCT Pub. Date: Apr. 29, 2010

(65) Prior Publication Data
US 2011/0181899 A1    Jul. 28, 2011

Related U.S. Application Data

(60) Provisional application No. 61/107,122, filed on Oct. 21, 2008.

(51) Int. Cl.
*H04N 1/60*     (2006.01)
(52) U.S. Cl.
USPC ............ 358/1.9; 358/518; 358/530; 427/162; 427/165; 427/166
(58) Field of Classification Search
None
See application file for complete search history.

(56) References Cited

U.S. PATENT DOCUMENTS

| | | | |
|---|---|---|---|
| 5,592,202 | A | 1/1997 | Erickson |
| 6,655,783 | B2 | 12/2003 | Otsuki |

(Continued)

FOREIGN PATENT DOCUMENTS

| | | | |
|---|---|---|---|
| CN | 1605465 A | 4/2005 | |
| CN | 1994739 A | 7/2007 | |

(Continued)

OTHER PUBLICATIONS

ISR Feb. 6, 2009; PCT International Search Report for Application No. PCT/US2008/086150; Young, Lee W., Authorized Officer; Feb. 6, 2009.

(Continued)

*Primary Examiner* — Dung Tran

(57) ABSTRACT

There is provided a method of forming a regular array of rows of subpixels on a workpiece. The subpixels have c different colors, where a colors are formed by printing. The subpixel pitch is s. The method includes (a) providing a printing head having a sets of z adjacent nozzles arranged in a row, wherein the spacing between adjacent nozzles within the same set is $p1=cs$ and the spacing between adjacent nozzles in different sets is $p2=(c+1)s$, the printing head being at a first position relative to the workpiece; (b) providing a different printing inks, one for each of the a colors; (c) supplying each of the printing inks to the nozzles such that each of the nozzles within a set receive the same color and a different color is supplied to each set of nozzles; (d) printing a first set of az rows of subpixels with the printing head; (e) moving the workpiece laterally relative to the printing head by a distance d, where $d=cz(s)$; (f) printing a second set of az rows of subpixels with the printing head; and (g) repeating steps (e) and (f) n−2 times for a total of n sets of az rows of subpixels. In the process, a, c, n, and z are independently integers greater than 1.

11 Claims, 7 Drawing Sheets

(56) References Cited

U.S. PATENT DOCUMENTS

| | | |
|---|---|---|
| 6,670,645 B2 | 12/2003 | Grushin et al. |
| 6,758,550 B2 | 7/2004 | Ito et al. |
| 7,067,170 B2 * | 6/2006 | Marcus et al. ............... 427/66 |
| 7,188,919 B2 * | 3/2007 | Satomura ..................... 347/12 |
| 7,296,868 B2 | 11/2007 | Shibata et al. |
| 7,381,444 B2 * | 6/2008 | Shigemura et al. ......... 427/162 |
| 7,459,177 B2 * | 12/2008 | Kimura et al. .............. 427/162 |
| 2003/0108804 A1 | 6/2003 | Cheng et al. |
| 2006/0121370 A1 | 6/2006 | Kim et al. |
| 2006/0228469 A1 * | 10/2006 | Shigemura et al. ......... 427/162 |
| 2006/0290732 A1 | 12/2006 | Park et al. |
| 2007/0190233 A1 * | 8/2007 | Chung ........................ 427/58 |
| 2007/0296796 A1 | 12/2007 | Lee et al. |
| 2008/0024552 A1 * | 1/2008 | White et al. ................. 347/41 |
| 2008/0067924 A1 | 3/2008 | Prakash et al. |
| 2008/0157659 A1 | 7/2008 | Prakash |
| 2008/0316398 A1 * | 12/2008 | Woo et al. ................... 349/110 |
| 2009/0004376 A1 * | 1/2009 | Lee .............................. 427/168 |
| 2010/0279081 A1 | 11/2010 | Koele et al. |
| 2011/0298863 A1 | 12/2011 | Truong et al. |
| 2012/0044512 A1 | 2/2012 | Truong et al. |
| 2012/0045568 A1 | 2/2012 | Truong et al. |

FOREIGN PATENT DOCUMENTS

| | | |
|---|---|---|
| JP | 04263949 A | 9/1992 |
| JP | 07025036 A | 1/1995 |
| JP | 08300694 A | 11/1996 |
| JP | 09138306 A | 5/1997 |
| JP | 11048503 A | 2/1999 |
| JP | 2001185355 A | 7/2001 |
| JP | 2003084125 A | 3/2003 |
| JP | 2003117460 A | 4/2003 |
| JP | 2004358314 A | 12/2004 |
| JP | 2005087801 A | 4/2005 |
| JP | 2005111727 A | 4/2005 |
| JP | 2005309160 A | 11/2005 |
| JP | 2007256312 A | 10/2007 |
| JP | 2007264378 A | 10/2007 |
| JP | 2007271812 A | 10/2007 |
| JP | 2008197149 A | 8/2008 |
| JP | 2011507190 A | 3/2011 |
| KR | 1020060064784 A | 6/2006 |
| KR | 100759838 B1 | 9/2007 |
| WO | 03008424 A1 | 1/2003 |
| WO | 03040257 A1 | 5/2003 |
| WO | 03063555 A1 | 7/2003 |
| WO | 03091688 A2 | 11/2003 |
| WO | 2004016710 A1 | 2/2004 |
| WO | 2007145979 A2 | 12/2007 |
| WO | 2009076396 A1 | 6/2009 |
| WO | 2010102274 A2 | 9/2010 |

OTHER PUBLICATIONS

ISR May 25, 2010; PCT International Search Report for Application No. PCT/US2009/06140; Kim, Ju Seung, Authorized Officer; May 25, 2010.

ISR Oct. 15, 2010; PCT International Search Report for Application No. PCT/US2010/026469; Han, Man Yeol, Authorized Officer; Oct. 15, 2010.

ISR Dec. 13, 2010; PCT International Search Report for Application No. PCT/US2010/037231; Kim, Chang Gyun, Authorized Officer; Dec. 13, 2010.

ISR Dec. 13, 2010; PCT International Search Report for Application No. PCT/US2010/037247; Kim, Chang Gyun, Authorized Officer; Dec. 13, 2010.

Extended European Search report for Application No. EP10784080. 3, counterpart to U.S. Appl. No. 13/266,322; Aug. 8, 2013.

Extended European Search report for Application No. EP10784090. 2, counterpart to U.S. Appl. No. 13/318,563; Aug. 16, 2013.

* cited by examiner

| Printer | Print # | 1 | 2 | 3 | 4 | 5 | | Pattern | Subpixel Row |
|---|---|---|---|---|---|---|---|---|---|
| Color M1 | A1 | M1 | | | | | | Color M1 row | 1 |
| | | | | | | | | | 2 |
| Color M1 | | M1 | | | | | | Color M1 row | 3 |
| | | | | | | | | | 4 |
| Color M1 | | M1 | | | | | | Color M1 row | 5 |
| | | | | | | | | | 6 |
| Color M1 | | M1 | | | | | | Color M1 row | 7 |
| | | | | | | | | | 8 |
| Color M1 | | M1 | | | | | | Color M1 row | 9 |
| | | | | | | | | | 10 |
| | A2 | | M1 | | | | | Color M1 row | 11 |
| Color M2 | | M2 | | | | | | Color M2 row | 12 |
| | | | M1 | | | | | Color M1 row | 13 |
| Color M2 | | M2 | | | | | | Color M2 row | 14 |
| | | | M1 | | | | | Color M1 row | 15 |
| Color M2 | | M2 | | | | | | Color M2 row | 16 |
| | | | M1 | | | | | Color M1 row | 17 |
| Color M2 | | M2 | | | | | | Color M2 row | 18 |
| | | | M1 | | | | | Color M1 row | 19 |
| Color M2 | | M2 | | | | | | Color M2 row | 20 |
| | A3 | | | M1 | | | | Color M1 row | 21 |
| | | | M2 | | | | | Color M2 row | 22 |
| | | | | M1 | | | | Color M1 row | 23 |
| | | | M2 | | | | | Color M2 row | 24 |
| | | | | M1 | | | | Color M1 row | 25 |
| | | | M2 | | | | | Color M2 row | 26 |
| | | | | M1 | | | | Color M1 row | 27 |
| | | | M2 | | | | | Color M2 row | 28 |
| | | | | M1 | | | | Color M1 row | 29 |
| | | | M2 | | | | | Color M2 row | 30 |
| | A4 | | | | M1 | | | Color M1 row | 31 |
| | | | | M2 | | | | Color M2 row | 32 |
| | | | | | M1 | | | Color M1 row | 33 |
| | | | | M2 | | | | Color M2 row | 34 |
| | | | | | M1 | | | Color M1 row | 35 |
| | | | | M2 | | | | Color M2 row | 36 |
| | | | | | M1 | | | Color M1 row | 37 |
| | | | | M2 | | | | Color M2 row | 38 |
| | | | | | M1 | | | Color M1 row | 39 |
| | | | | M2 | | | | Color M2 row | 40 |
| | | | | | | | | | 41 |
| | | | | | | M2 | | Color M2 row | 42 |
| | | | | | | | | | 43 |
| | | | | | | M2 | | Color M2 row | 44 |
| | | | | | | | | | 45 |
| | | | | | | M2 | | Color M2 row | 46 |
| | | | | | | | | | 47 |
| | | | | | | M2 | | Color M2 row | 48 |
| | | | | | | | | | 49 |
| | | | | | | M2 | | Color M2 row | 50 |

| Printer | | Print # | 1 | 2 | 3 | 4 | | Subpixel Row | Printed Pattern | Pattern after Non-Printing Step |
|---|---|---|---|---|---|---|---|---|---|---|
| Red | A1 | | Red | | | | | 1 | Red row | Red row |
| | | | | | | | | 2 | | |
| | | | | | | | | 3 | | |
| Red | | | Red | | | | | 4 | Red row | Red row |
| | | | | | | | | 5 | | |
| | | | | | | | | 6 | | |
| Red | | | Red | | | | | 7 | Red row | Red row |
| | | | | | | | | 8 | | |
| | | | | | | | | 9 | | |
| Red | | | Red | | | | | 10 | Red row | Red row |
| | | | | | | | | 11 | | |
| | | | | | | | | 12 | | |
| | A2 | | | Red | | | | 13 | Red row | Red row |
| Green | | | Green | | | | | 14 | Green row | Green row |
| | | | | | | | | 15 | | Blue row |
| | | | | Red | | | | 16 | Red row | Red row |
| Green | | | Green | | | | | 17 | Green row | Green row |
| | | | | | | | | 18 | | Blue row |
| | | | | Red | | | | 19 | Red row | Red row |
| Green | | | Green | | | | | 20 | Green row | Green row |
| | | | | | | | | 21 | | Blue row |
| | | | | Red | | | | 22 | Red row | Red row |
| Green | | | Green | | | | | 23 | Green row | Green row |
| | | | | | | | | 24 | | Blue row |
| | A3 | | | | Red | | | 25 | Red row | Red row |
| | | | | Green | | | | 26 | Green row | Green row |
| | | | | | | | | 27 | | Blue row |
| | | | | | Red | | | 28 | Red row | Red row |
| | | | | Green | | | | 29 | Green row | Green row |
| | | | | | | | | 30 | | Blue row |
| | | | | | Red | | | 31 | Red row | Red row |
| | | | | Green | | | | 32 | Green row | Green row |
| | | | | | | | | 33 | | Blue row |
| | | | | | Red | | | 34 | Red row | Red row |
| | | | | Green | | | | 35 | Green row | Green row |
| | | | | | | | | 36 | | Blue row |
| | A4 | | | | | Red | | 37 | Red row | Red row |
| | | | | | Green | | | 38 | Green row | Green row |
| | | | | | | | | 39 | | Blue row |
| | | | | | | Red | | 40 | Red row | Red row |
| | | | | | Green | | | 41 | Green row | Green row |
| | | | | | | | | 42 | | Blue row |
| | | | | | | Red | | 43 | Red row | Red row |
| | | | | | Green | | | 44 | Green row | Green row |
| | | | | | | | | 45 | | Blue row |
| | | | | | | Red | | 46 | Red row | Red row |
| | | | | | Green | | | 47 | Green row | Green row |
| | | | | | | | | 48 | | Blue row |
| | | | | | | | | 49 | | |
| | | | | | | Green | | 50 | Green row | Green row |
| | | | | | | | | 51 | | |
| | | | | | | | | 52 | | |
| | | | | | | Green | | 53 | Green row | Green row |
| | | | | | | | | 54 | | |
| | | | | | | | | 55 | | |
| | | | | | | Green | | 56 | Green row | Green row |
| | | | | | | | | 57 | | |
| | | | | | | | | 58 | | |
| | | | | | | Green | | 59 | Green row | Green row |

MULTICOLOR ELECTRONIC DEVICES AND PROCESSES OF FORMING THE SAME BY PRINTING

FIELD OF THE DISCLOSURE

This disclosure relates in general to electronic devices and processes, and more particularly, to electronic devices having electrodes and organic active regions of different colors, and processes of forming the same.

DESCRIPTION OF THE RELATED ART

An electronic device can include a liquid crystal display ("LCD"), an organic light-emitting diode (OLED) display, or the like. The manufacture of electronic devices may be performed using solution deposition techniques. One process of making electronic devices is to deposit organic layers over a substrate by printing (e.g., ink-jet printing, continuous printing, etc.). In a printing process, the liquid composition being printed includes an organic material in a solution, dispersion, emulsion, or suspension with an organic solvent, with an aqueous solvent, or with a combination of solvents. After printing, the solvent(s) is (are) evaporated and the organic material remains to form an organic layer for the electronic device.

Typically, a first color is printed and then the printing device is recalibrated and a second color is printed. In some cases, the substrate with the first printed color is moved to a second printer for printing the second color. This also requires time for setting up the printer and alignment. In many cases, three colors are printed: red, green, and blue. In this case, time must be taken to recalibrate and/or realign with each color. In some cases, some colors are applied by printing and some are applied by non-printing deposition. There is a need for improved deposition processes.

SUMMARY

There is provided a method of forming a regular array of rows of subpixels on a workpiece, the subpixels having c different colors and having a subpixel pitch s, wherein a of the colors are formed by printing, said method comprising:
  (a) providing a printing head having a sets of z adjacent nozzles arranged in a row, wherein the spacing between adjacent nozzles within the same set is $p1=cs$ and the spacing between adjacent nozzles in different sets is $p2=(c+1)s$, the printing head being at a first position relative to the workpiece;
  (b) providing a different printing inks, one for each of the a colors;
  (c) supplying each of the printing inks to the nozzles such that each of the nozzles within a set receive the same color and a different color is supplied to each set of nozzles;
  (d) printing a first set of az rows of subpixels with the printing head;
  (e) moving the workpiece laterally relative to the printing head by a distance d, where $d=cz(s)$;
  (f) printing a second set of az rows of subpixels with the printing head;
  (g) repeating steps (e) and (f) n−2 times for a total of n sets of az rows of subpixels;
where:
  a is an integer greater than 1;
  c is an integer greater than 1;
  n is an integer greater than 1, and
  z is an integer greater than 1.

There is also provided the method described above wherein b colors are applied by a non-printing method and further comprising the steps:
  (h) providing b different materials for non-printing deposition;
  (i) depositing each of the b materials separately onto the workpiece by a non-printing method;
where:
  b is an integer greater than 0; and $$c=a+b.$$

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 3 includes a diagram illustrating a printing method with three printed colors.

FIG. 4 includes a diagram illustrating a printing method with two printed colors.

FIG. 5 includes a diagram illustrating a printing method with three printed colors and two non-printed colors.

FIG. 6 includes a diagram illustrating a printing method with two printed colors and two non-printed colors.

FIG. 7 includes a diagram illustrating a printing method with red and green printed colors, where blue color is deposited by a non-printing method.

Figure 1:
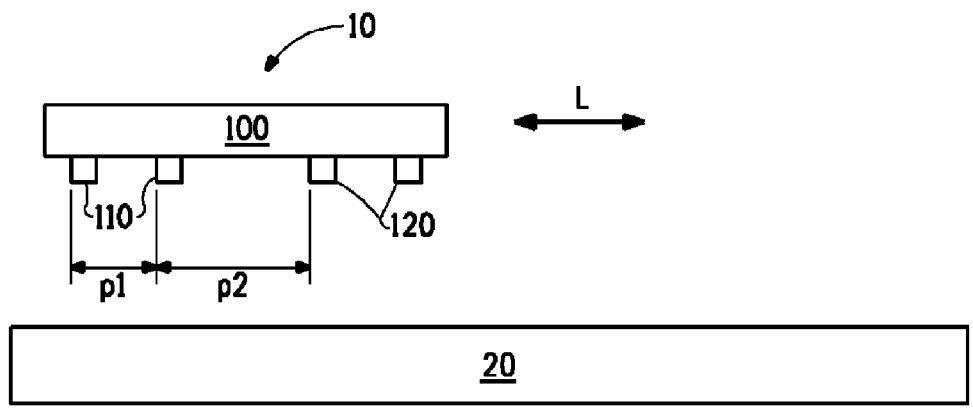
FIG. 1 includes an illustration of a cross-sectional view of the workpiece and a printer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Printer, the Method of Printing, the Non-Printing Method, and the Electronic Device.

1. Definitions and Clarification of Terms

Before addressing details of embodiments described below, some terms are defined or clarified.

The term "adjacent" as it applies to the nozzles, is intended to mean that the nozzles are immediately next to each other.

The term "array" is intended to mean an ordered arrangement of elements. An array may include pixels, subpixels, cells, or other structures within an ordered arrangement, usually designated by columns and rows. The array can be described in terms of an x-direction and a y-direction.

The term "blue" refers to a wavelength in a range of approximately 400 to 500 nm.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "electronic device" is intended to mean a collection of circuits, electronic components, or any combination thereof that collectively, when properly electrically connected and supplied with the appropriate potential(s), performs a function. An electronic device may be included or be part of a system. An example of an electronic device includes a display, a sensor array, a computer system, an avionics system, an automobile, a cellular phone, other consumer or industrial electronic product, or any combination thereof.

The term "green" refers to a wavelength in a range of approximately 500 to 600 nm.

The term "guest material" is intended to mean a material, within a layer including a host material, that changes the electronic characteristic(s) or the targeted wavelength of radiation emission, reception, or filtering of the layer compared to the electronic characteristic(s) or the wavelength of radiation emission, reception, or filtering of the layer in the absence of such material.

The term "host material" is intended to mean a material, usually in the form of a layer, to which a guest material may or may not be added. The host material may or may not have electronic characteristic(s) or the ability to emit, receive, or filter radiation.

The term "light-emitting material" is intended to mean a material that is capable of emitting visible radiation. "Visible" refers to the radiation spectrum having wavelengths corresponding to approximately 400 to 700 nm.

The term "liquid composition" is intended to mean a material that is dissolved in a liquid medium to form a solution, dispersed in a liquid medium to form a dispersion, or suspended in a liquid medium to form a suspension or an emulsion.

The term "liquid medium" is intended to mean a liquid within a solution, dispersion, suspension, or emulsion. The term "liquid medium" is used regardless whether one or more solvents are present, and therefore, liquid medium is used as the singular or plural form (i.e., liquid media) of the term.

The term "nozzle" is intended to mean a portion of an apparatus through which a liquid composition or liquid medium can be dispensed.

The term "printing ink" is intended to mean a liquid composition comprising a light-emitting material of one color.

The term "oriented" is intended to mean a principal direction in which a feature extends. As between different features at the same elevation or at different elevations, the features may be oriented substantially parallel, substantially perpendicular, or in another angular relationship with respect to each other.

The term "pitch" is intended to mean a sum of a feature dimension and a space dimension between immediately adjacent features.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions.

The term "printing" is intended to mean an act of selectively depositing a layer by using a printing head or other similar structure to dispense a liquid or liquid composition onto a workpiece.

The term "printing apparatus" is intended to mean a combination of one or more materials, equipment, assembly or subassembly designed for printing a layer onto a workpiece.

The term "red" refers to a wavelength in a range of approximately 600 to 700 nm.

The term "workpiece" is intended to mean a substrate with one or more device layers thereon. A device layer can be inorganic or organic.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Printer

Before addressing particular embodiments, the printer is addressed to aid in understanding the concepts as described herein.

As shown in FIG. 1, printer 10 has a printing head 100 with a first set of two nozzles 110 and a second set of two nozzles 120 attached. The spacing between the nozzles 110 in the same set is shown as p1. The spacing between adjacent nozzles 110 and 120 in different sets is shown as p2. The printer is attached to lines (not shown) to supply the appropriate liquid composition to each nozzle. The different liquid compositions, one for each color, are supplied such that nozzles 110 in the first set receive a first color and nozzles 120 in the second set receive a second color which is different from the first.

The printing head is shown over workpiece 20. The printing head and workpiece can be moved with respect to each other, as shown by L. This lateral movement is relative. In some cases, the workpiece is moved. In some cases, the printing head is moved. In some cases, both the printing head and the workpiece are moved. For simplicity, the movement will be addressed as if only the printing head moved, and as if the workpiece were stationary. It will be understood that either or both of the printing head and workpiece can be moved and it is only their movement relative to each other that is at issue.

In the embodiment shown in FIG. 1, the printer has 4 nozzles. The actual number of nozzles can be greater than this and is limited only by practical manufacturing considerations. In some embodiments, the number of nozzles ranges from 6 to 24.

The printing delivery can be by any known system for depositing liquid materials in a pattern. Some examples of printing techniques include, but are not limited to, ink jet and continuous nozzle spray.

3. Method of Printing

Figure 2:
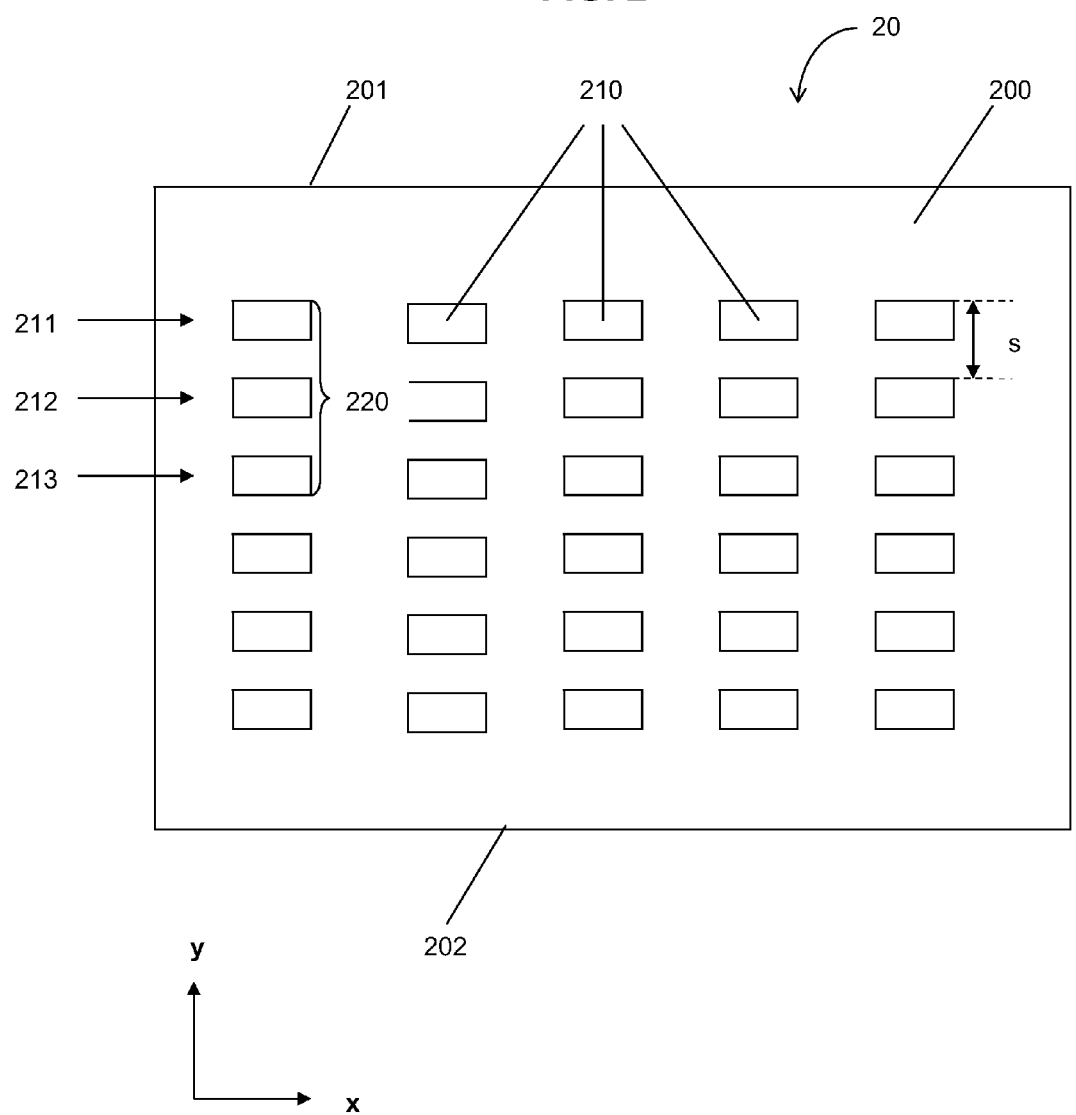
FIG. 2 includes a plan view of a workpiece for making an electronic device including a display.

FIG. 2 includes a plan view of workpiece 20 for making an electronic device. The workpiece includes a substrate 200 having a regular array of subpixel openings 210. The workpiece has a first edge 201 and an opposite edge 202. Only a few subpixels are illustrated in the figure. In practice, devices may have hundreds of subpixels or more. In some embodiments, the subpixel openings are defined by a containment structure (not shown) which can be a physical containment structure, a chemical containment structure, or both. The subpixel openings 210 are in a regular array of rows, shown as 211, 212, and 213. The subpixel pitch is shown as s. In this illustration, three subpixels together form pixel 220. In the illustrated embodiment, the subpixels 210 have a rectangular shape. Other subpixel shapes can be used, such as circular, oval, square, or polygonal. The printing direction is shown as x in the figure. Lateral movement is defined as movement in the y direction, perpendicular to the printing direction.

In the method described herein, a regular array of rows of subpixels is formed on a workpiece. The subpixels have a subpixel pitch s. The printing steps include:

(a) providing a printing head having a sets of z adjacent nozzles arranged in a row, wherein the spacing between adjacent nozzles within the same set is $p1=cs$ and the spacing between adjacent nozzles in different sets is $p2=(c+1)s$, the printing head being at a first position relative to the workpiece;

(b) providing a different printing inks, one for each of the a colors;

(c) supplying each of the printing inks to the nozzles such that each of the nozzles within a set receive the same color and a different color is supplied to each set of nozzles;

(d) printing a first set of az rows of subpixels with the printing head;

(e) moving the workpiece laterally relative to the printing head by a distance d, where $d=czs$;

(f) printing a second set of az rows of subpixels with the printing head; and (g) repeating steps (e) and (f) n−2 times for a total of n sets of az rows of subpixels;

where:
a is an integer greater than 0;
c is an integer greater than 2;
n is an integer greater than 1, and
z is an integer greater than 1.

The printing head has az nozzles, where a is the number of printed colors and z is the number of nozzles for any given color. The nozzles of each color are grouped together, so that the printing head has all of the nozzles for the first color, and then all the nozzles for the second color, and so forth. In some embodiments, c is 3 or 4. In some embodiments, when c=3, the colors are red, blue and green. In some embodiments, b=2 and the printed colors are red and green. In some embodiments, when c=4, the colors are red, blue, green and white. In some embodiments, b=3 and the printed colors are red, green and white.

The printing head starts at a first printing position over the workpiece. This first position is referred to as A1, which will be discussed in a later section. In some embodiments, the printer is positioned at one edge of the workpiece, shown as 201 in FIG. 2, and aligned to be over the first row of subpixels. The nozzles are spaced apart by a distance so that they are all aligned to print in the subpixel rows. Thus, they are spaced apart by multiples of the subpixel pitch, s. The term "multiple of a number" means a value which is the number times an integer greater than 0. The nozzles within each set are spaced apart by $p1=cs$. Adjacent nozzles of different sets, in other words, adjacent nozzles for printing different colors, are spaced apart by $p2=(c+1)s$ The printer prints across the workpiece in the x-direction to print a first set of rows of subpixels. The number of rows printed is equal to the total number of nozzles on the printing head.

After completion of the printing of the first set of rows, the printing head moves laterally across the workpiece to an adjacent printing position. This position is referred to as A2, which will be discussed in a later section. This movement is parallel to the plane of the workpiece and in the y-direction, which is perpendicular to the row direction. The distance moved, d, is also a multiple of the subpixel pitch, s, and $d=czs$. A second set of az rows is then printed. The printing can be in the opposite direction from the first printing or the printing head can return to the same side as for the first printing and print in the same direction. This is determined by the equipment and the software.

The steps of moving by d and printing az subpixel rows are continued until the printer has reached the opposite edge of the workpiece, shown as 202 in FIG. 2. Thus, the above steps are repeated n−2 times, for a total of n sets of subpixel rows printed. The number n can be very large in order to accommodate the printing of a display. In some embodiments, n is at least 50; in some embodiments, n is at least 100. The upper limit for the value of n is determined by the subpixel pitch, s, and the size of the workpiece to be printed. The subpixel pitch, s, is determined by the desired resolution. In some embodiments, s is in the range of 1-20 microns. In this printing method, a few of the subpixel openings will not be printed at the first edge and at the opposite edge. These will be waste areas on the workpiece.

In practice, the subpixel rows can be printed in any order. The movements of the printing head relative to the workpiece will be as discussed above, and the n sets of az subpixel rows will be printed starting from position A1, A2, A3, etc., but not necessarily in order. The exact order of printing will be determined by the most efficient way to utilize the printer.

Figure 3:
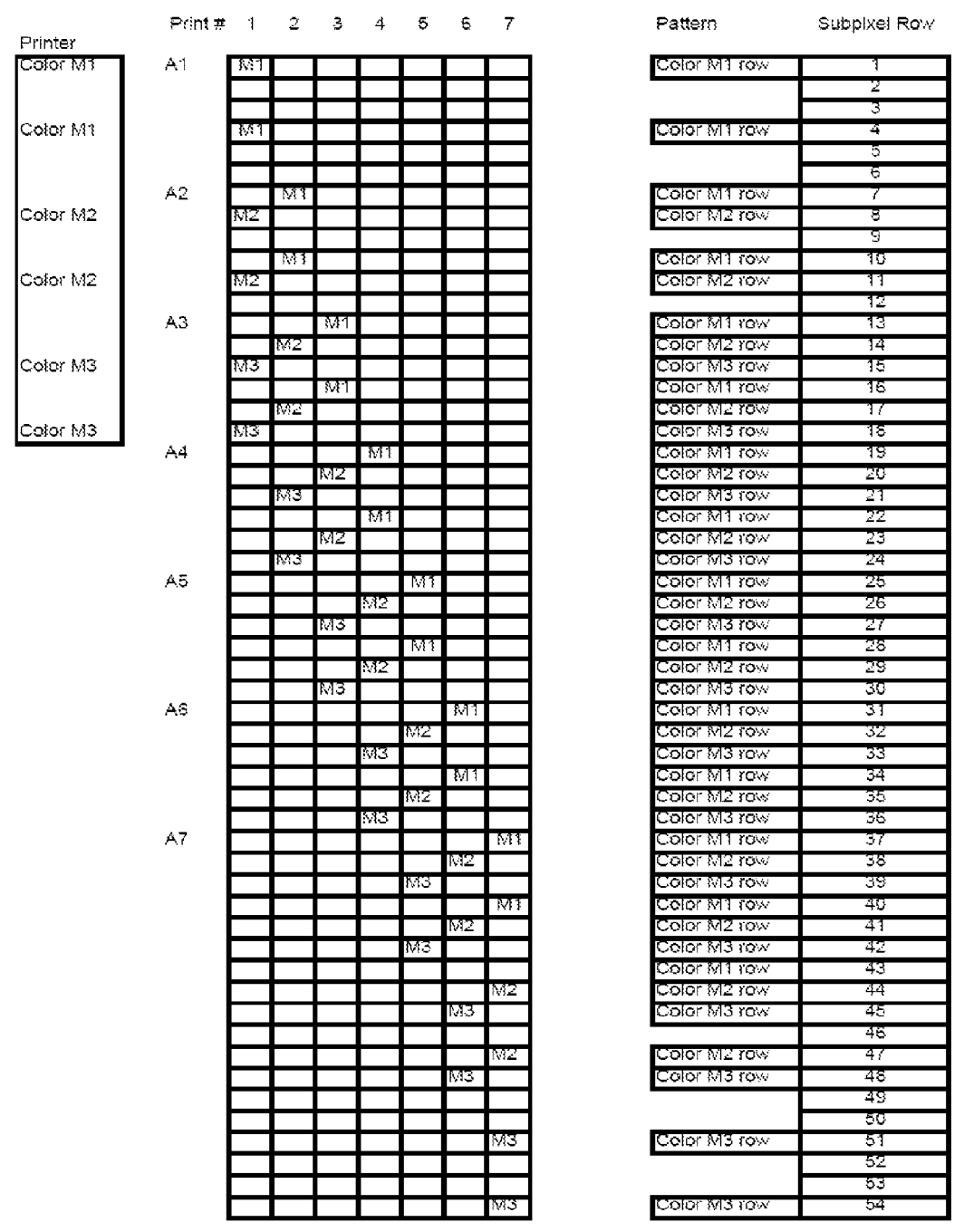

The method described herein is illustrated further in FIG. 3. In FIG. 3 there are 3 printed colors, M1, M2, and M3. There are 2 nozzles for each color on the printing head. Thus, in this illustration:

a=3
c=3, and
z=2.

The colors are arranged as shown under the column labeled "Printer." The first two nozzles are for color M1, the next two nozzles are for color M2, and the last two nozzles are for color M3. The spacing between nozzles of the same color is c, which is 3 subpixel units. The spacing between the adjacent M1 and M2 nozzles and adjacent M2 and M3 nozzles is c+1, which is 4 subpixel units. The printing head is positioned at the first edge with the first nozzle, having color M1, over subpixel row 1. This is the first printing position shown as A1. The position A1 is defined as the subpixel row over which the first nozzle is placed. The printer prints across the workpiece in the row direction to form rows of color M1 in subpixel rows 1 and 4, rows of color M2 in subpixel rows 8 and 11, and rows of color M3 in subpixel rows 15 and 18. This is shown in the column labeled Print #1. Only one subpixel is shown for each color for purposes of clarity, but each represents an entire row of subpixels. The printer then shifts laterally by a distance d which is equal to cz subpixel units, and in this case is 6. This is position A2 for the printer. The printer then prints a second set of rows: rows of color M1 in subpixel rows 7 and 10, rows of color M2 in subpixel rows 14 and 17, and rows of color M3 in subpixel rows 21 and 24, as shown in the column labeled Print #2. Print #2 is shown shifted to the right of Print #1 for purposes of clarity. Both Print #1 and Print #2, as well as all the other Print numbers, represent full rows of printed subpixels across the workpiece. The printer then again shifts laterally by 6 subpixel units. This is position A3 for the printer. The printer then prints a third set of rows: rows of color M1 in subpixel rows 13 and 16, rows of color M2 in subpixel rows 20 and 23, and rows of color M3 in subpixel rows 27 and 30, as shown in the column labeled Print #3. In this example, the process is repeated for position A4 and Print #4, position A5 and Print #5, position A6 and Print #6, and finally, position A7 and Print #7. Thus, in this example n=7, and the total number of printed rows is naz=42.

At this time the printing has reached the opposite edge of the workpiece. In practice, most devices will require many more rows, up to hundreds of subpixel rows and more, and these rows will be printed in an analogous manner. The 42 subpixel rows in the figure are shown only as an illustration.

The printed outcome is shown in the column labeled "Pattern". It can be seen that subpixels are missing for subpixel rows at the A1 edge and the opposite edge. Thus the usable device area is from subpixel row 13 to subpixel row 45.

In FIG. 4 there are 2 printed colors, M1 and M2. There are 5 nozzles for each color on the printing head. Thus, in this illustration:

a=2
c=2, and
z=5.

The colors are arranged as shown under the column labeled "Printer." The first five nozzles are for color M1, the next five nozzles are for color M2. The spacing between nozzles of the same color is c, which is 2 subpixel units. The spacing between the adjacent M1 and M2 nozzles is c+1, which is 3 subpixel units. The printing head is positioned at A1, over subpixel row 1, as discussed with respect to FIG. 3. The printer prints across the workpiece in the row direction to form rows of color M1 in subpixel rows 1, 3, 5, 7, and 9, and rows of color M2 in subpixel rows 12, 14, 16, 18, and 20. This is shown in the column labeled Print #1. As in FIG. 3, only one subpixel is shown for each color for purposes of clarity, but each represents an entire row of subpixels. The printer then shifts laterally by a distance d which is equal to cz subpixel units, and in this case is 10. This is position A2 for the printer. The printer then prints a second set of rows: rows of color M1 in subpixel rows 11, 13, 15, 17, and 19; rows of color M2 in subpixel rows 22, 24, 26, 28, and 30, as shown in the column labeled Print #2. Print #2 is shown shifted to the right of Print #1 for purposes of clarity. Both Print #1 and Print #2, as well as all the other Print numbers, represent full rows of printed subpixels across the workpiece. The printer then again shifts laterally by 10 subpixel units. This is position A3 for the printer. The printer then prints a third set of rows: rows of color M1 in subpixel rows 21, 23, 25, 27, and 29; rows of color M2 in subpixel rows 32, 34, 36, 38, and 40, as shown in the column labeled Print #3. In this example, the process is repeated for position A4 and Print #4. Thus, in this example n=4, and the total number of printed rows is naz=40.

At this time the printing has reached the opposite edge of the workpiece. As discussed above, in practice many more rows are printed and the 40 subpixel rows in the figure are shown only as an illustration.

The printed outcome is shown in the column labeled "Pattern". It can be seen that subpixels are missing for subpixel rows at the A1 edge and the opposite edge. Thus the usable device area is from subpixel row 13 to subpixel row 40.

4. Non-Printing Method

In some embodiments, not all the colors of a device are printed. One or more colors are deposited using other deposition methods. Such methods include, but are not limited to, vapor deposition, thermal transfer, and continuous liquid deposition techniques such as spin coating, gravure coating, curtain coating, dip coating, slot-die coating, and spray coating. Such methods are well-known and documented. Combinations of printing and non-printing deposition have been disclosed in, for example, published applications US-2008-0067924 and US-2008-0157659.

In this embodiment, the printing must leave open spaces for the non-printed colors, which can be applied before or after the printing step. In some embodiments, the non-printed colors are applied as an overall layer. In some embodiments, the non-printed colors are pixelated. By "pixelated" is meant that the color is deposited only in the subpixel areas for that color. In some embodiments, at least one non-printed color is applied overall and at least one non-printed color is pixelated.

In this embodiment, the number of colors printed is a, as defined above, and the number of colors that are deposited by a non-printing method is b. The total number of colors is c=a+b.

The non-printing steps are:
(h) providing b different materials for non-printing deposition; and
(i) depositing each of the b materials separately onto the workpiece by a non-printing method
where b is an integer greater than 0.

The non-printed colors can be deposited before or after the printed colors. In some embodiments, the non-printed colors are deposited after the printed colors.

In some embodiments, b is 1. In some embodiments, the non-printed material is deposited by vapor deposition. In some embodiments, the non-printed material is blue-emissive material and is deposited overall by vapor deposition after the printing steps. In some embodiments, the non-printed material is red emissive material and is deposited overall.

Figure 5:
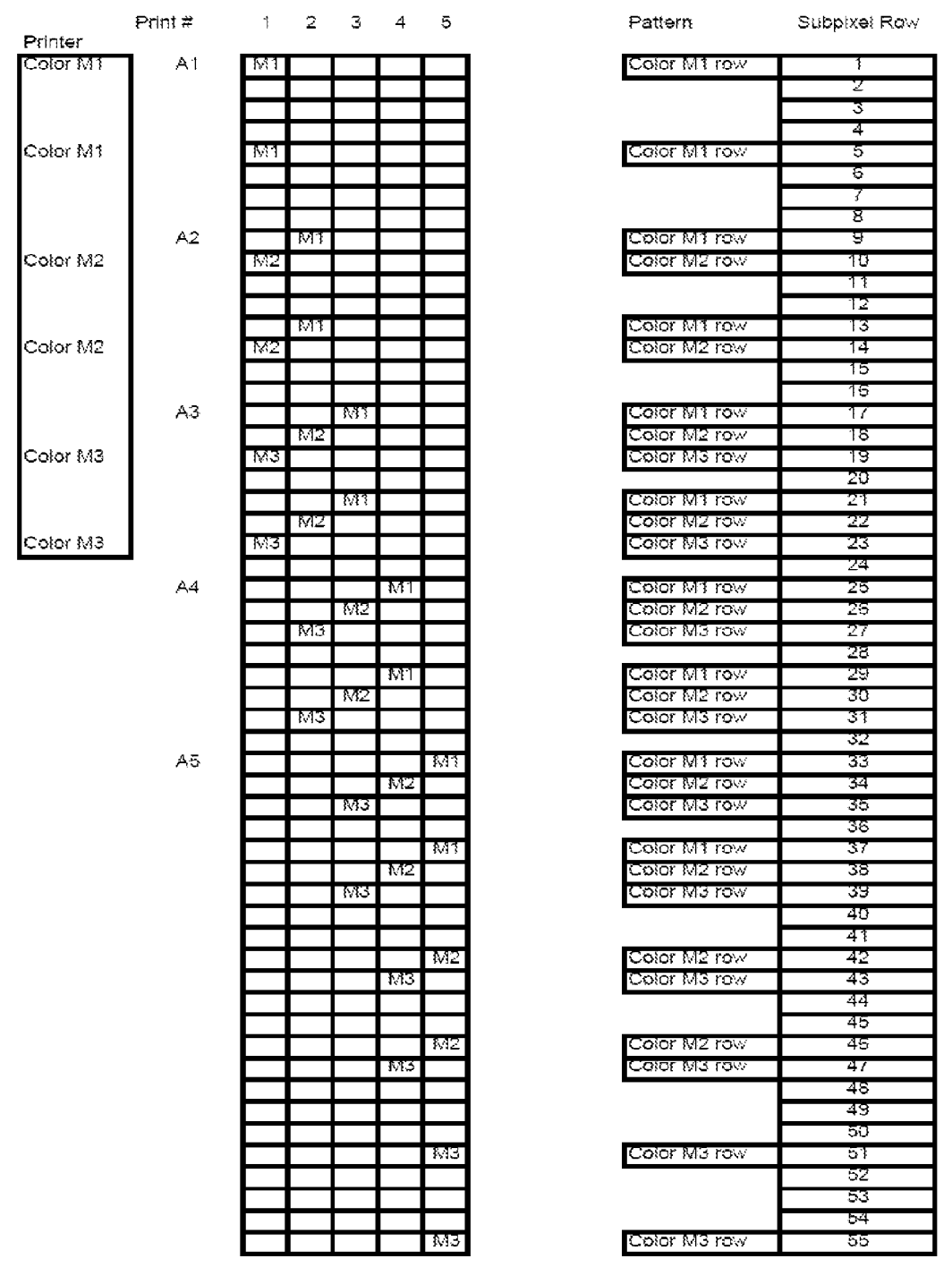
Figure 6:
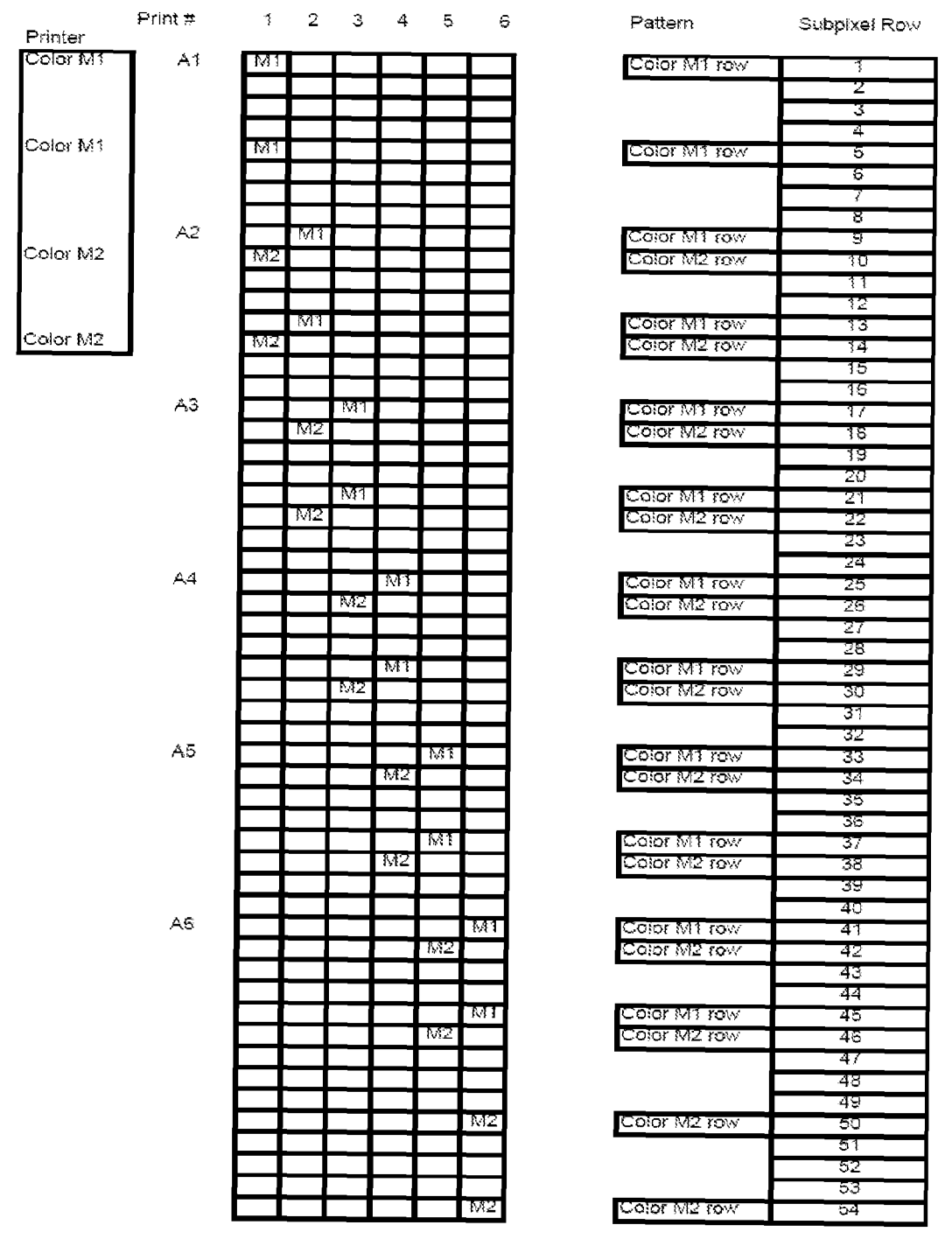

The method including non-printing deposition is illustrated further in FIGS. 5-7. In FIG. 5 there are 3 printed colors, M1, M2, and M3, with one additional color to be applied by non-printing deposition. There are 2 nozzles for each color on the printing head. Thus, in this illustration:

a=3
b=1
c=4, and
z=2.

The colors are arranged as shown under the column labeled "Printer." The first two nozzles are for color M1, the next two nozzles are for color M2, and the last two nozzles are for color M3. The spacing between nozzles of the same color is c, which is 4 subpixel units. The spacing between the adjacent M1 and M2 nozzles is c+1, which is 5 subpixel units. The printing head is positioned at A1, over subpixel row 1, as discussed with respect to FIG. 3. The printer prints across the workpiece in the row direction to form rows of color M1 in subpixel rows 1 and 5, rows of color M2 in subpixel rows 10 and 14, and rows of color M3 in subpixel rows 19 and 23. This is shown in the column labeled Print #1. As in FIG. 3, only one subpixel is shown for each color for purposes of clarity, but each represents an entire row of subpixels. The printer then shifts laterally by a distance d which is equal to cz subpixel units, and in this case is 8. This is position A2 for the printer. The printer then prints a second set of rows: rows of color M1 in subpixel rows 9 and 13; rows of color M2 in subpixel rows 18 and 22; and rows of color M3 in subpixel rows 27 and 31, as shown in the column labeled Print #2. Print #2 is shown shifted to the right of Print #1 for purposes of clarity. Both Print #1 and Print #2, as well as all the other Print numbers, represent full rows of printed subpixels across the workpiece. The printer then again shifts laterally by 8 subpixel units. This is position A3 for the printer. The printer then prints a third set of rows: rows of color M1 in subpixel rows 17 and 21; rows of color M2 in subpixel rows 26 and 30; and rows of color M3 in subpixel rows 35 and 39, as shown in the column labeled Print #3. In this example, the process is repeated for position A4 and Print #4, and position A5 and Print #5. Thus, in this example n=5, and the total number of printed rows is naz=30.

At this time the printing has reached the opposite edge of the workpiece. As discussed above, in practice many more rows are printed and the 30 subpixel rows in the figure are shown only as an illustration.

The printed outcome is shown in the column labeled "Pattern". It can be seen that subpixels are missing for subpixel rows at the A1 edge and the opposite edge. Subpixel spaces are available for the non-printing deposition of color M4 at subpixel rows 20, 24, 28, 32, 36, and 40, to make complete 4-color pixel units. Thus the usable device area is from subpixel row 17 to subpixel row 40.

In FIG. 6 there are 2 printed colors, M1 and M2, with two additional colors, M3 and M4, to be applied by non-printing deposition. There are 2 nozzles for each color on the printing head. Thus, in this illustration:

a=2
b=2
c=4, and
z=2.

The colors are arranged as shown under the column labeled "Printer." The first two nozzles are for color M1, the next two nozzles are for color M2. The spacing between nozzles of the same color is c, which is 4 subpixel units. The spacing between the adjacent M1 and M2 nozzles is c+1, which is 5 subpixel units. The printing head is positioned at A1, over subpixel row 1, as discussed above with respect to FIG. 3. The printer prints across the workpiece in the row direction to form rows of color M1 in subpixel rows 1 and 5, and rows of color M2 in subpixel rows 10 and 14. This is shown in the column labeled Print #1. As in FIG. 3, only one subpixel is shown for each color for purposes of clarity, but each represents an entire row of subpixels. The printer then shifts laterally by a distance d which is equal to cz subpixel units, and in this case is 8. This is position A2 for the printer. The printer then prints a second set of rows: rows of color M1 in subpixel rows 9 and 13; and rows of color M2 in subpixel rows 18 and 22, as shown in the column labeled Print #2. Print #2 is shown shifted to the right of Print #1 for purposes of clarity. Both Print #1 and Print #2, as well as all the other Print numbers, represent full rows of printed subpixels across the workpiece. The printer then again shifts laterally by 8 subpixel units. This is position A3 for the printer. The printer then prints a third set of rows: rows of color M1 in subpixel rows 17 and 21; and rows of color M2 in subpixel rows 26 and 30, as shown in the column labeled Print #3. In this example, the process is repeated for position A4 and Print #4, position A5 and Print #5, and position A6 and Print #6. Thus, in this example n=6, and the total number of printed rows is naz=24.

At this time the printing has reached the opposite edge of the workpiece. As discussed above, in practice many more rows are printed and the 24 subpixel rows in the figure are shown only as an illustration.

The printed outcome is shown in the column labeled "Pattern". It can be seen that subpixels are missing for subpixel rows at the A1 edge and the opposite edge. Subpixel spaces are available for depositing color M3 by a non-printing method at subpixel rows 11, 15, 19, 23, 27, 31, 35, 39, 43, and 47; and for depositing color M4 by a non-printing method at subpixel rows 12, 16, 20, 24, 28, 32, 36, 40, 44, and 48, to make complete 43-color pixel units. Thus the usable device area is from subpixel row 9 to subpixel row 48.

In FIG. 7 there are 2 printed colors, red and green, with blue being applied by non-printing deposition. There are 4 nozzles for each color on the printing head. Thus, in this illustration:

a=2
b=1
c=3, and
z=4.

The colors are arranged as shown under the column labeled "Printer." The first four nozzles are for red, the next two nozzles are for green. The spacing between nozzles of the same color is c, which is 3 subpixel units. The spacing between the adjacent red and green nozzles is c+1, which is 4 subpixel units. The printing head is positioned at A1, over subpixel row 1, as discussed above with respect to FIG. 3. The printer prints across the workpiece in the row direction to form rows of red in subpixel rows 1, 4, 7, and 10, and rows of green in subpixel rows 14, 17, 20, and 23. This is shown in the column labeled Print #1. As in FIG. 3, only one subpixel is shown for each color for purposes of clarity, but each represents an entire row of subpixels. The printer then shifts laterally by a distance d which is equal to cz subpixel units, and in this case is 12. This is position A2 for the printer. The printer then prints a second set of rows: rows of red in subpixel rows 13, 16, 19, and 22; and rows of green in subpixel rows 26, 29, 32, and 35, as shown in the column labeled Print #2. Print #2 is shown shifted to the right of Print #1 for purposes of clarity. Both Print #1 and Print #2, as well as all the other Print numbers, represent full rows of printed subpixels across the workpiece. The printer then again shifts laterally by 12 subpixel units. This is position A3 for the printer. The printer then prints a third set of rows: rows of red in subpixel rows 25, 28, 31, and 34; and rows of green in subpixel rows 38, 41, 44, and 47, as shown in the column labeled Print #3. In this example, the process is repeated for position A4 and Print #4. Thus, in this example n=4, and the total number of printed rows is naz=32.

At this time the printing has reached the opposite edge of the workpiece. As discussed above, in practice many more rows are printed and the 32 subpixel rows in the figure are shown only as an illustration.

The printed outcome is shown in the column labeled "Printed Pattern". It can be seen that subpixels are missing for subpixel rows at the A1 edge and the opposite edge. Blue is deposited by a non-printing method in the appropriate open subpixel rows to form complete 3-color pixel units, with the results shown in the column labeled "Pattern after Non-Printing Dep." Thus the usable device area is from subpixel row 13 to subpixel row 48.

5. Electronic Device

Devices for which the printing method described herein can be used include organic electronic devices. The term "organic electronic device" or sometimes just "electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers. Additional electroactive layers may be present between the light-emitting layer and the electrical contact layer(s), as is well known.

It is well known to use organic light-emitting compounds as the active component in such devices to provide the necessary colors. The method described herein is suitable for the deposition of light-emitting materials having different colors of emission. The printing steps are carried out by printing liquid compositions containing the light-emitting materials. The non-printing steps can be carried out with the materials alone, or from liquid compositions containing the light-emitting materials.

Any light-emitting material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum light-emitting compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

A suitable liquid medium for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methylpyrrolidone) esters (such as ethylacetate) alcohols (isopropanol), keytones (cyclopentatone) and mixtures thereof. Suitable solvents for light-emitting materials have been described in, for example, published PCT application WO 2007/145979.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of forming a regular array of rows of subpixels on a workpiece, the subpixels having c different colors and having a subpixel pitch s, wherein a of the colors are formed by printing, said method comprising:
    (a) providing a printing head having at least two sets of z adjacent nozzles arranged in a row, wherein the spacing between adjacent nozzles within the same set is $p1=cs$ and the spacing between the adjacent sets of nozzles is p2=(c+1)s, the printing head being at a first position relative to the workpiece;
(b) providing a different printing ink, one for each of the a colors;
(c) supplying each of the printing inks to the nozzles such that each of the nozzles within a set receive the same color and a different color is supplied to each set of nozzles;
(d) printing a first set of az rows of subpixels with the printing head;
(e) moving the workpiece laterally relative to the printing head by a distance d, where d=cz(s);
(f) printing a second set of az rows of subpixels with the printing head;
(g) repeating steps (e) and (f) n−2 times for a total of n sets of az rows of subpixels;
where:
a is an integer greater than 1;
c is an integer greater than 1;
n is an integer greater than 1; and
z is an integer greater than 1
wherein c=4 and the colors are red, blue, green and white.

2. The method of claim 1, wherein a is an integer selected from 3 and 4.

3. The method of claim 1, wherein z is an integer from 4-8.

4. The method of claim 2, further comprising the steps:
(h) providing b different materials for non-printing deposition;
(i) depositing each of the b materials separately onto the workpiece by a non-printing method;
where:
b is an integer greater than 0, and $$c=a+b.$$

5. The method of claim 4, wherein the non-printing method is vapor deposition.

6. The method of claim 5, wherein the vapor deposition is overall.

7. The method of claim 5, wherein the vapor deposition is pixellated.

8. The method of claim 1, wherein a=c.

9. The method of claim 8, wherein a is an integer selected from 3 and 4.

10. The method of claim 1, wherein s is in the range of 1-20 microns.

11. The method of claim 10, wherein a=c.

* * * * *